(12) United States Patent
Lee et al.

(10) Patent No.: US 12,191,272 B2
(45) Date of Patent: *Jan. 7, 2025

(54) PACKAGE STRUCTURE

(71) Applicant: Taiwan Semiconductor Manufacturing Company, Ltd., Hsinchu (TW)

(72) Inventors: Tsung-Yen Lee, Changhua County (TW); Chin-Hua Wang, New Taipei (TW); Ming-Chih Yew, Hsinchu (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/080,674

(22) Filed: Dec. 13, 2022

(65) Prior Publication Data

US 2023/0114584 A1 Apr. 13, 2023

Related U.S. Application Data

(63) Continuation of application No. 17/185,992, filed on Feb. 26, 2021, now Pat. No. 11,557,559.

(51) Int. Cl.
*H01L 23/00* (2006.01)
*H01L 23/16* (2006.01)
(Continued)

(52) U.S. Cl.
CPC .............. *H01L 24/14* (2013.01); *H01L 23/16* (2013.01); *H01L 23/31* (2013.01); *H01L 23/40* (2013.01);
(Continued)

(58) Field of Classification Search
CPC .......... H01L 24/14; H01L 23/16; H01L 23/31; H01L 23/40; H01L 2224/12105; H01L 2224/16145
See application file for complete search history.

(56) References Cited

U.S. PATENT DOCUMENTS

6,809,421 B1 * 10/2004 Hayasaka ............... H01L 25/50
257/621
9,000,584 B2 4/2015 Lin et al.
(Continued)

*Primary Examiner* — Peniel M Gumedzoe
(74) *Attorney, Agent, or Firm* — JCIPRNET (57) ABSTRACT

A package structure including an organic interposer substrate, a semiconductor die, conductive bumps, an underfill, and an insulating encapsulation is provided. The organic interposer substrate includes stacked organic dielectric layers and conductive wirings embedded in the stacked organic dielectric layers. The semiconductor die is disposed over and electrically connected to the conductive wirings of the organic interposer substrate, and the semiconductor die includes chamfered edges. The conductive bumps are disposed between the semiconductor die and the organic interposer substrate, and the semiconductor die is electrically connected to the organic interposer substrate through the conductive bumps. The underfill is disposed between the semiconductor die and the organic interposer substrate, wherein the underfill encapsulates the conductive bumps and is in contact with the chamfered edges of the at least one semiconductor die. The insulating encapsulation covers the organic interposer substrate and laterally encapsulates the least one semiconductor die and the underfill.

20 Claims, 9 Drawing Sheets

(51) Int. Cl.
*H01L 23/31* (2006.01)
*H01L 23/40* (2006.01)
(52) U.S. Cl.
CPC .............. *H01L 2224/12105* (2013.01); *H01L 2224/16145* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2004/0256715 A1* | 12/2004 | Seki ................... H01L 23/49827 257/E21.503 |
| 2008/0006900 A1* | 1/2008 | Chan ................... H01L 21/563 257/E23.125 |
| 2008/0142956 A1* | 6/2008 | Cambou ................. H01L 24/32 257/723 |
| 2015/0125993 A1* | 5/2015 | Lee ................... H01L 23/49827 438/107 |
| 2017/0309579 A1* | 10/2017 | Wang ................... H01L 23/3114 |
| 2018/0254250 A1* | 9/2018 | Wang ................... H01L 23/562 |
| 2019/0221445 A1* | 7/2019 | Chiu ................... H01L 21/486 |

* cited by examiner

PACKAGE STRUCTURE

CROSS-REFERENCE TO RELATED APPLICATION

This application is a continuation application of and claims the priority benefit of a prior application Ser. No. 17/185,992, filed on Feb. 26, 2021. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, Chip-on-Wafer-on-Substrate (CoWoS) package structures are becoming increasingly popular for their multi-functions and high performance. However, there are challenges (e.g., warpage issue) related to packaging process of the CoWoS package structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1A:
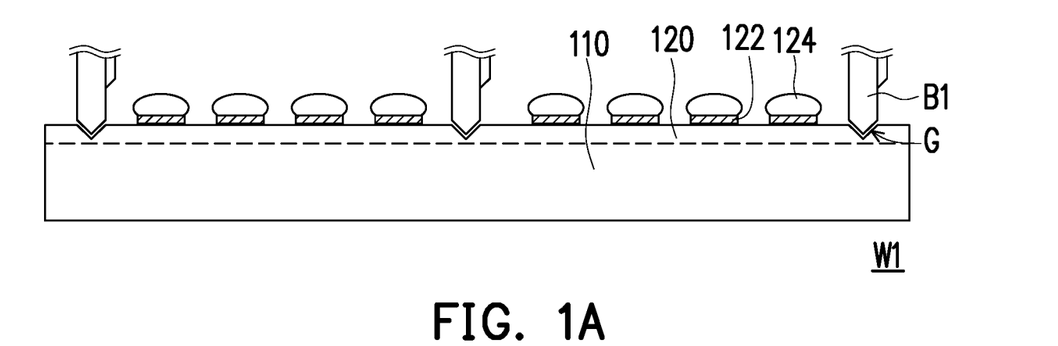
FIGS. 1A through 1C are cross-sectional views schematically illustrating a fabrication process of semiconductor dies in accordance with some embodiments of the present disclosure.
Figure 1B:
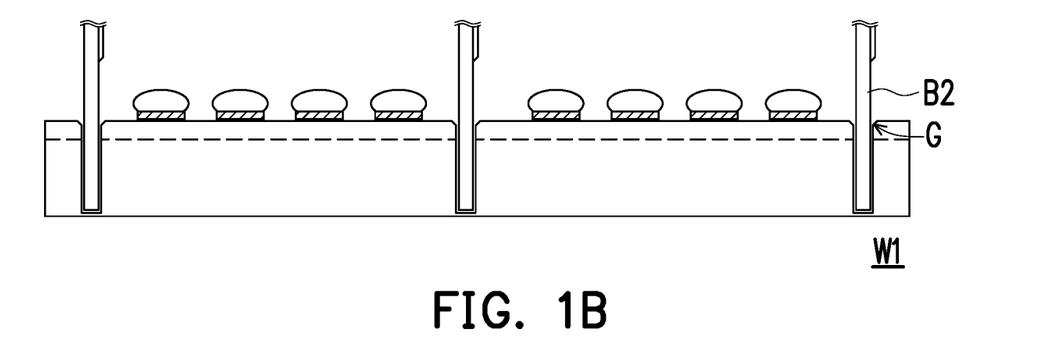
Figure 1C:
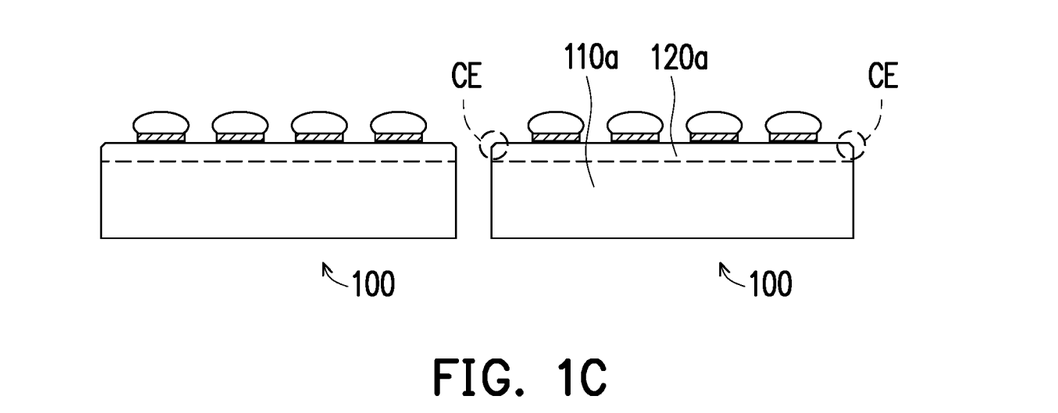

FIGS. 1A through 1C are cross-sectional views schematically illustrating a fabrication process of semiconductor dies in accordance with some embodiments of the present disclosure.

Referring to FIG. 1A, a semiconductor wafer W1 is provided. The semiconductor wafer W1 may include various doped regions (e.g., p-type doped regions or n-type doped regions) formed through front end of line (FEOL) fabrication processes of the semiconductor wafer W1. The doped regions may be doped with p-type and/or n-type dopants. The doped regions may be doped with p-type dopants, such as boron or BF2; n-type dopants, such as phosphorus or arsenic; and/or combinations thereof. The doped regions may be configured for an n-type FinFET, a p-type FinFET or the combination thereof. In some other embodiments, the doped regions may be configured for an n-type MOSFET, a p-type MOSFET or the combination thereof. The semiconductor wafer W1 may include a semiconductor substrate 110 and an interconnect structure 120, wherein the interconnect structure 120 is disposed on the semiconductor substrate 110. In some embodiments, the semiconductor substrate 110 includes a crystalline silicon substrate. In some alternative embodiments, the semiconductor substrate 110 is made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The interconnect structure 120 may include interconnect wirings (e.g., copper interconnect wirings) and dielectric layer stacked alternately, wherein the interconnect wirings of the interconnect structure 120 are electrically connected to the active components and/or the passive components in the semiconductor substrate 110. The interconnect structure 120 is formed through back end of line (BEOL) fabrication processes of the semiconductor wafer W1. The topmost interconnect wirings of the interconnect structure 120 may include conductive pads 122, and the conductive pads 122 may be aluminum pads, copper pads, or other suitable metallic pads. The interconnect structure 120 may further include a passivation layer (not shown) disposed on a front surface or an active surface of the semiconductor wafer W1, wherein the conductive pads 122 are partially covered by the passivation layer. In other words, the conductive pads 122 are partially revealed from the openings defined in the passivation layer. The passivation layer may be a silicon oxide layer, a silicon nitride layer, a silicon oxy-nitride layer, or a dielectric layer formed by other suitable inorganic dielectric materials. The interconnect structure 120 may further include a post-passivation layer (not shown) formed over the passivation layer, wherein the post-passivation layer covers the passivation layer and the conductive pads 122, the post-passivation layer includes contact openings, and the conductive pads 122 are partially revealed from the contact openings defined in the post passivation layer. The post-passivation layer may be a polyimide (PI) layer, a PBO layer, or a dielectric layer formed by other suitable organic dielectric materials. In some alternative embodiments, the post-passivation layer is omitted.

In some embodiments, a wafer level bumping process is performed on the interconnect structure 120 of the semiconductor wafer W1 such that conductive terminals 124 are formed on the conductive pads 122. The conductive pads 122 of the interconnect structure 120 may be bump pads, and the conductive terminals 124 may be micro bumps landing on the conductive pads 122. The wafer level bumping process may include: forming a patterned photoresist over the front surface or active surface of the semiconductor wafer W1, wherein the patterned photoresist includes openings for revealing the conductive pads 122; depositing (e.g., plating) conductive material on the conductive pads 122 to form the conductive terminals 124 in the openings defined in the patterned photoresist; and removing the patterned photoresist. In some embodiments, the conductive terminals 124 may include Cu/Ni/Au bumps, Cu/Ni bumps, Cu/Ni/Au/SnAg bumps, Cu/Ni/SnAg bumps, or the like.

As illustrated in FIG. 1A, after forming the conductive terminals 124, a bevel cutting process is performed to form V-shaped grooves G on the front surface of the semiconductor wafer W1. The V-shaped grooves G may be formed by a wafer dicing process performed along scribe lines of the semiconductor wafer W1. The V-shaped grooves G may be formed through a V-shaped dicing blade B1. In some embodiments, the depth of the V-shaped grooves G is smaller than the thickness of the interconnect structure 120, wherein the depth of the V-shaped grooves G ranges from about 5 micrometers to about 20 micrometers, and the width of the V-shaped grooves G ranges from about 10 micrometers to about 100 micrometers. In some alternative embodiments, the depth of the V-shaped grooves G is greater than the thickness of the interconnect structure 120, wherein the depth of the V-shaped grooves G ranges from about 20 micrometers to about 700 micrometers, and the width of the V-shaped grooves G ranges from about 100 micrometers to about 1000 micrometers.

Referring to FIG. 1B and FIG. 1C, after performing the bevel cutting process, a full cutting process is performed along the V-shaped grooves G on the front surface of the semiconductor wafer W1 such that singulated semiconductor dies 100 are obtained. Each singulated semiconductor dies 100 includes a semiconductor substrate 110a, an interconnect structure 120a disposed on the semiconductor substrate 110a, conductive pads 122, and conductive terminals 124 in some embodiments. Each singulated semiconductor dies 100 includes chamfered edges CE, and the chamfered edges CE are distributed at a periphery region of the front surface of each semiconductor die 100 in some embodiments. In some alternative embodiments, the chamfered edges CE are distributed at side walls of the semiconductor die 100 facing a supporting substrate. The full cutting process may be performed through a dicing blade B2 along the V-shaped grooves G1 formed on the semiconductor wafer W1. The width of the dicing blade B2 is smaller than the width of the V-shaped grooves G. In some embodiments, the semiconductor wafer W1 is attached onto a dicing tape (not shown) before performing the full cutting process.

Figure 7A:
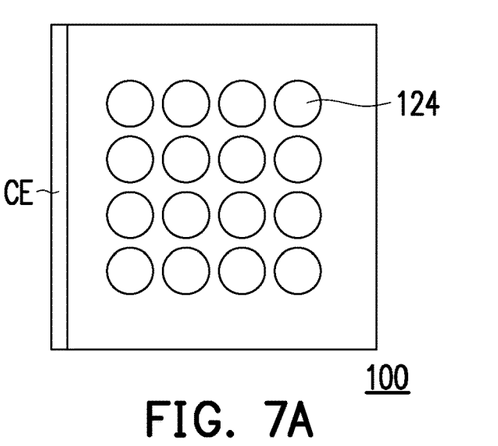
FIGS. 7A through 7E are bottom views schematically illustrating various chamfered edges in accordance with some other embodiments of the present disclosure.
Figure 7B:
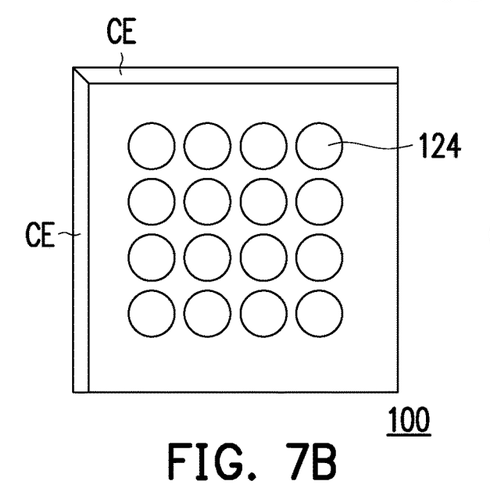
Figure 7C:
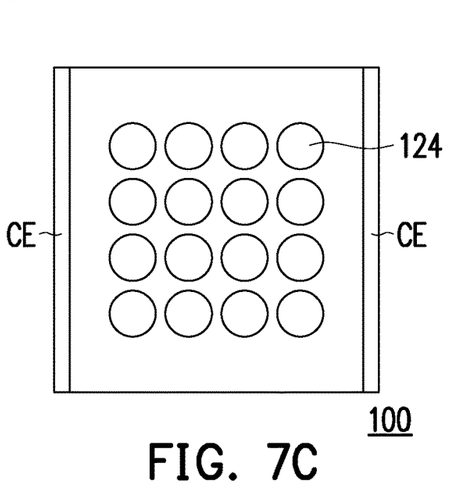
Figure 7D:
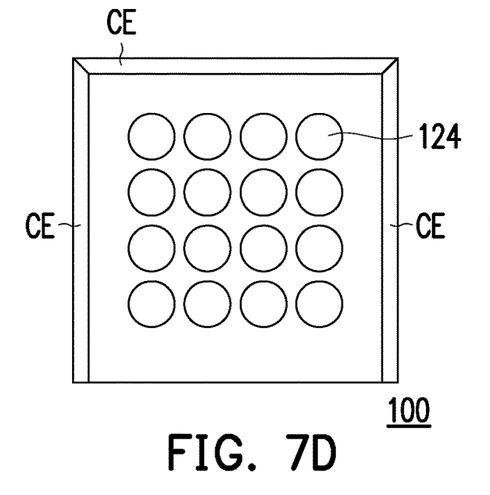
Figure 7E:
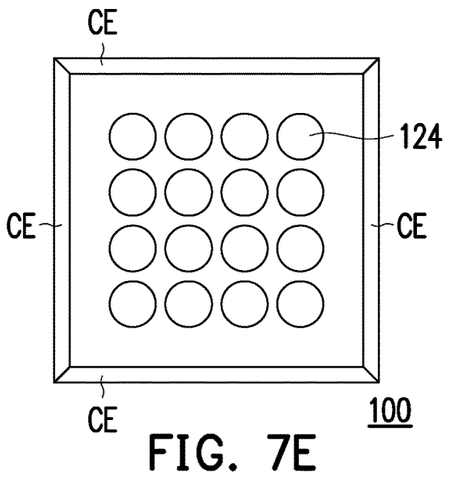

In top views of the semiconductor die 100, as illustrated in FIGS. 7A through 7E, at least one chamfered edge CE are distributed at one or more side walls of the semiconductor die 100. As illustrated in FIG. 7A, only one chamfered edge CE is distributed along one side wall of the semiconductor die 100. As illustrated in FIG. 7B, two adjoined chamfered edges CE are distributed along two neighboring side walls of the semiconductor die 100. As illustrated in FIG. 7C, two chamfered edges CE are distributed along two opposite side walls of the semiconductor die 100. As illustrated in FIG. 7D, three adjoined chamfered edges CE are distributed along three neighboring side walls of the semiconductor die 100. As illustrated in FIG. 7E, four adjoined chamfered edges CE are distributed along four side walls of the semiconductor die 100.

FIGS. 2A through 2D are cross-sectional views schematically illustrating a fabrication process of semiconductor dies in accordance with some alternative embodiments of the present disclosure.

Figure 2A:
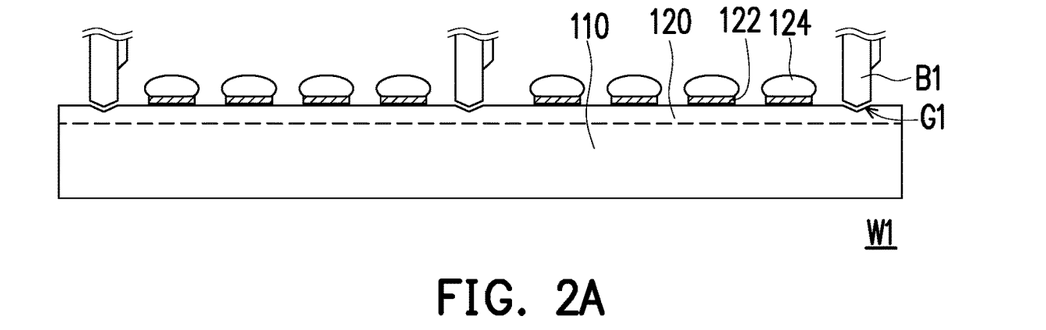
FIGS. 2A through 2D are cross-sectional views schematically illustrating a fabrication process of semiconductor dies in accordance with some alternative embodiments of the present disclosure.
Figure 2B:
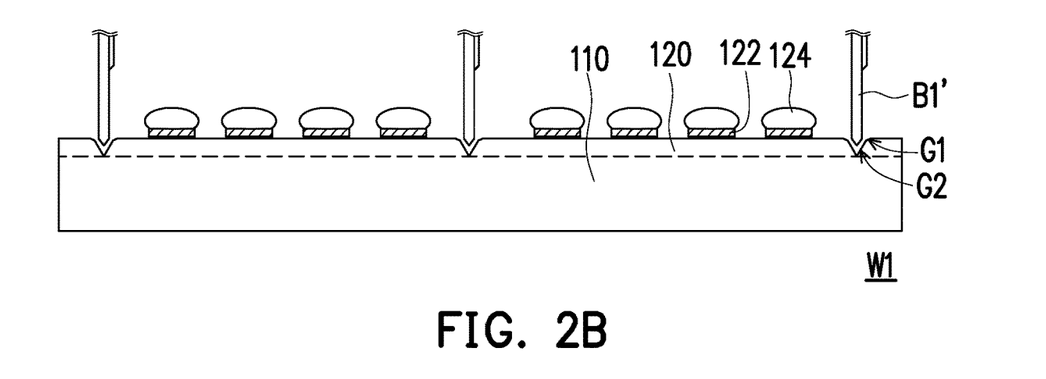

Referring to FIGS. 2A through 2D and FIGS. 1A through 1C, the fabrication process illustrated in FIGS. 2A through 2D are similar to the fabrication process illustrated in FIGS. 1A through 1C except that two bevel cutting processes are performed before the full cutting process. As illustrated in FIG. 2A and FIG. 2B, a first bevel cutting process is performed to form first V-shaped grooves G1 on the front surface of the semiconductor wafer W1. After the first V-shaped grooves are formed, a second bevel cutting process is performed along the first V-shaped grooves G1 to form second V-shaped grooves G2 on the front surface of the semiconductor wafer W1. The first V-shaped grooves G1 and the second V-shaped grooves G2 may be formed by two wafer dicing processes performed along scribe lines of the semiconductor wafer W1. The first V-shaped grooves G1 may be formed through a V-shaped dicing blade B1, and the second V-shaped grooves G2 may be formed through another V-shaped dicing blade B1'. The depth of the second V-shaped grooves G2 is greater than the depth of the first V-shaped grooves G1, and the width of the first V-shaped grooves G1 is greater than the width of the second V-shaped grooves G2. In some embodiments, the depth of the first V-shaped grooves G1 ranges from about 5 micrometers to about 700 micrometers, the width of the V-shaped grooves G1 ranges from about 10 micrometers to about 1000 micrometers, the depth of the V-shaped grooves G2 ranges from about 5 micrometers to about 700 micrometers, and the width of the V-shaped grooves G2 ranges from about 10 micrometers to about 900 micrometers.

Figure 2C:
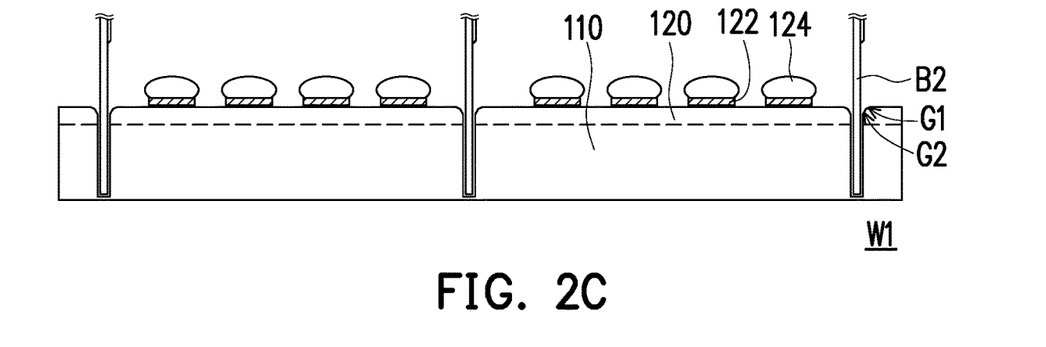
Figure 2D:
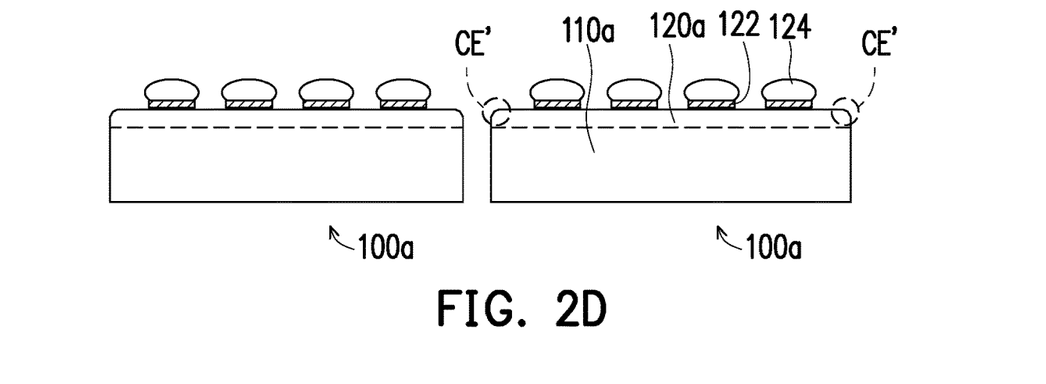

Referring to FIG. 2C and FIG. 2D, after performing the first and second bevel cutting processes, a full cutting process is performed along the first V-shaped grooves G1 and the second V-shaped grooves G2 distributed on the front surface of the semiconductor wafer W1 such that singulated semiconductor dies 100a are obtained. Each singulated semiconductor dies 100a includes a semiconductor substrate 110a, an interconnect structure 120a disposed on the semiconductor substrate 110a, conductive pads 122, and conductive terminals 124 in some embodiments. Each singulated semiconductor dies 100a includes chamfered edges CE', and the chamfered edges CE' are distributed at a periphery region of the front surface of each semiconductor die 100a in some embodiments. The full cutting process may be performed through a dicing blade B2 along the first and second V-shaped grooves G1 and G2 formed on the semiconductor wafer W1. The width of the dicing blade B2 is smaller than the width of the first and second V-shaped grooves G1 and G2. In some embodiments, the semiconductor wafer W1 is attached onto a dicing tape (not shown) before performing the full cutting process.

FIGS. 3A through 3G are cross-sectional views schematically illustrating a fabrication process of a Chip-on-Wafer-on-Substrate (CoWoS) package structure in accordance with some embodiments of the present disclosure.

Figure 3A:
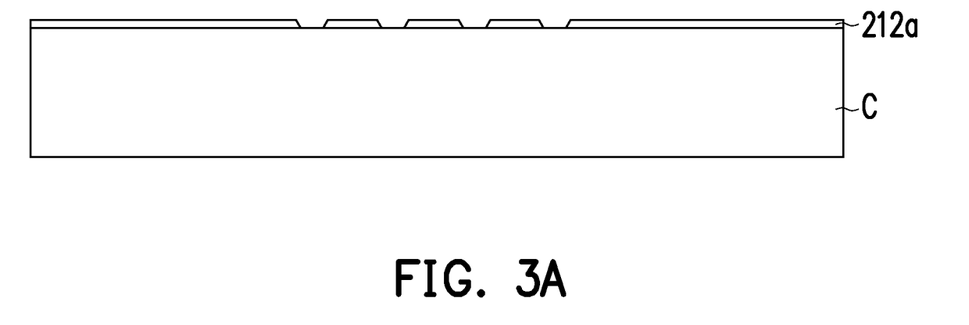
FIGS. 3A through 3G are cross-sectional views schematically illustrating a fabrication process of a Chip-on-Wafer-on-Substrate (CoWoS) package structure in accordance with some embodiments of the present disclosure.
Figure 3B:
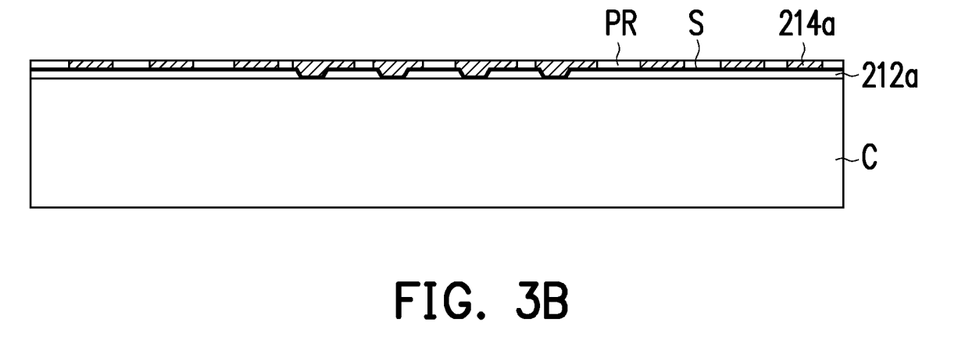
Figure 3C:
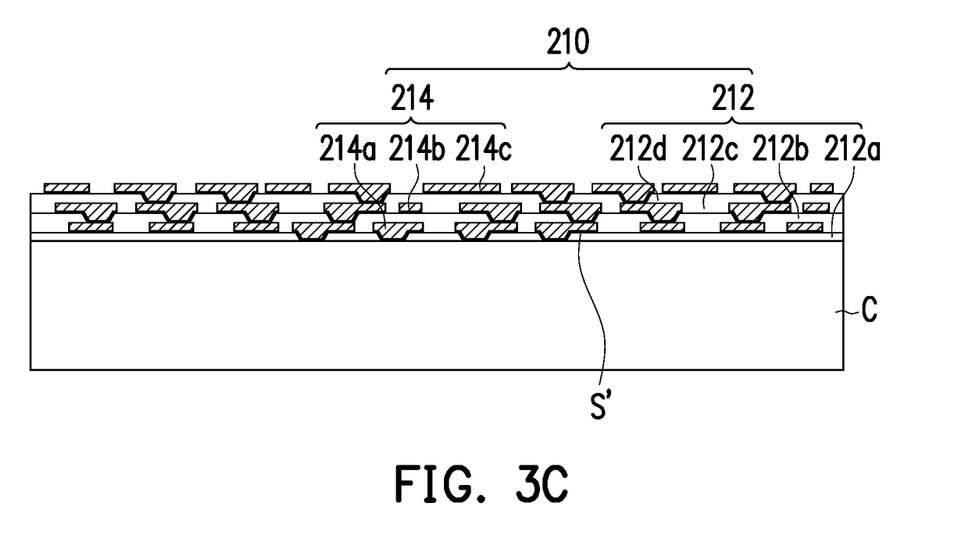

Referring to FIG. 3A through FIG. 3C, a carrier C is provided and an organic interposer substrate 210 is formed over the carrier C. In some embodiments, the wafer form organic interposer substrate 210 is formed over a wafer form carrier C (e.g., a silicon wafer). The organic interposer substrate 210 may include stacked organic dielectric layers 212 and conductive wirings 214 between the stacked organic dielectric layers 212. The stacked organic dielectric layers 212 are stacked over the carrier C. The conductive wirings 214 are embedded in the stacked organic dielectric layers 212 carried by the carrier C. In some embodiments, a coefficient of thermal expansion of the stacked organic dielectric layers 212 is greater than a coefficient of thermal expansion of a semiconductor substrate 110 of the semiconductor die 100.

As illustrated in FIG. 3A, a first organic dielectric layer 212a is formed over the carrier C. The first organic dielectric layer 212a may include openings and portions of the carrier C are revealed by the openings defined in the first organic dielectric layer 212a. In some embodiments, the material of the first organic dielectric layer 212a includes polybenzoxazole (PBO), polyimide (PI) or other suitable polymer dielectric material. In some alternative embodiments, the material of the first organic dielectric layer 212a includes resin mixed with filler. The first organic dielectric layer 212a may be formed by photo-patternable material and patterned by a photolithography process.

As illustrated in FIG. 3B, a seed layer S is formed over the carrier C to cover the first organic dielectric layer 212a and the portions of the carriers C which are revealed by the openings defined in the first organic dielectric layer 212a. The seed layer S may be sputter Ti/Cu seed layer which entirely covers the first dielectric layer 112a. After forming the seed layer S, a patterned photoresist layer PR is formed on the seed layer S. The patterned photoresist layer PR includes trenches, and portions of the seed layer S are revealed by the trenches defined in the patterned photoresist layer PR. After the patterned photoresist layer PR is formed on the seed layer S, a plating process may be performed by using the patterned photoresist layer PR as a mask such that first conductive wirings 214a are plated in the trench and cover the revealed portions of the seed layer S.

After forming the first conductive wirings 214a, the patterned photoresist layer PR is removed such that portions of the seed layer S that are not covered by the first conductive wirings 214a are revealed, and a patterned seed layer S' is formed under the first conductive wirings 214a. An etching process may be performed to remove the portions of the seed layer S that are not covered by the first conductive wirings 214a until portions of the first organic dielectric layer 212a are revealed. As illustrated in FIG. 3B, the first conductive wirings 214a and the patterned seed layer S' may be considered as a layer of conductive wirings.

As illustrated in FIG. 3C, after the first organic dielectric layer 212a and the first conductive wirings 214a are formed, a second organic dielectric layer 212b, second conductive wirings 214b, a third organic dielectric layer 212c, third conductive wirings 214c and a fourth organic dielectric layer 212d may be formed over the carrier C such that the organic interposer substrate 210 is formed. The fabrication process of the second organic dielectric layer 212b, the third organic dielectric layer 212c and the fourth organic dielectric layer 212d may be similar to that of the first organic dielectric layer 212a. The fabrication process of the second conductive wirings 214b and the third conductive wirings 214c may be similar to that of the first conductive wirings 214a. The number of the stacked organic dielectric layers 212 and the conductive wirings 214 in the organic interposer substrate 210 may be modified in accordance with design rule of products. The conductive wirings 214 may include conductive wirings and conductive vias electrically connected between conductive wirings, wherein the conductive wirings may transmit signal horizontally, and the conductive vias may transmit signal vertically. The material of the conductive wirings 214 may include copper or other suitable metallic materials.

Figure 3D:
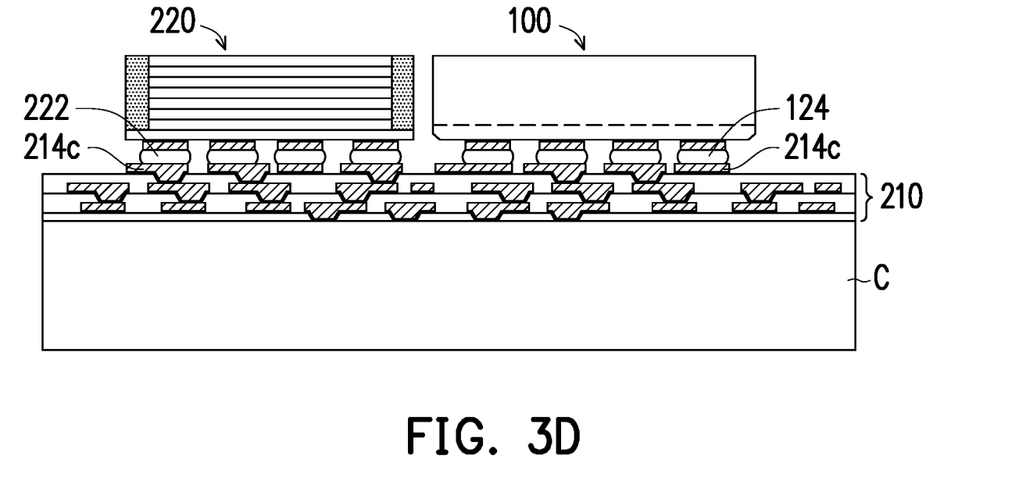

Referring to FIG. 3D, after the organic interposer substrate 210 is formed over the carrier C, at least one semiconductor die 100 (shown in FIG. 1C) and at least one semiconductor device 220 are provided and mounted onto the organic interposer substrate 210 through, for example, a chip-on-wafer (CoW) bonding process. The at least one semiconductor die 100 and the at least one semiconductor device 220 are electrically connected to the organic interposer substrate 210 through bump joints. Conductive terminals 124 of the semiconductor dies 100 and conductive terminals 222 of the at least one semiconductor device 220 may be electrically connected to the third conductive wirings 214c of the organic interposer substrate 210. In some embodiments, the conductive terminals 124 include Cu/Ni/Au bumps, Cu/Ni bumps, Cu/Ni/Au/SnAg bumps, Cu/Ni/SnAg bumps, or the like, and the conductive terminals 222 include Cu/Ni/Au bumps, Cu/Ni bumps, Cu/Ni/Au/SnAg bumps, Cu/Ni/SnAg bumps, or the like. The structure of the conductive terminals 124 may be the same as or different from that of the conductive terminals 222. The at least one semiconductor die 100 may include logic dies, and the at least one semiconductor device 220 may include memory device. In some alternative embodiments, the at least one semiconductor die 100 includes system-on-chip (SOC) logic die, and the at least one semiconductor device 220 includes a high bandwidth memory (HBM) cube, wherein the HBM cube at least includes stacked memory dies. In some alternative embodiments, the semiconductor die 100 may include system-on-integrated-chips (SoIC) structure or application specific integrated circuit (ASIC) die.

Figure 3E:
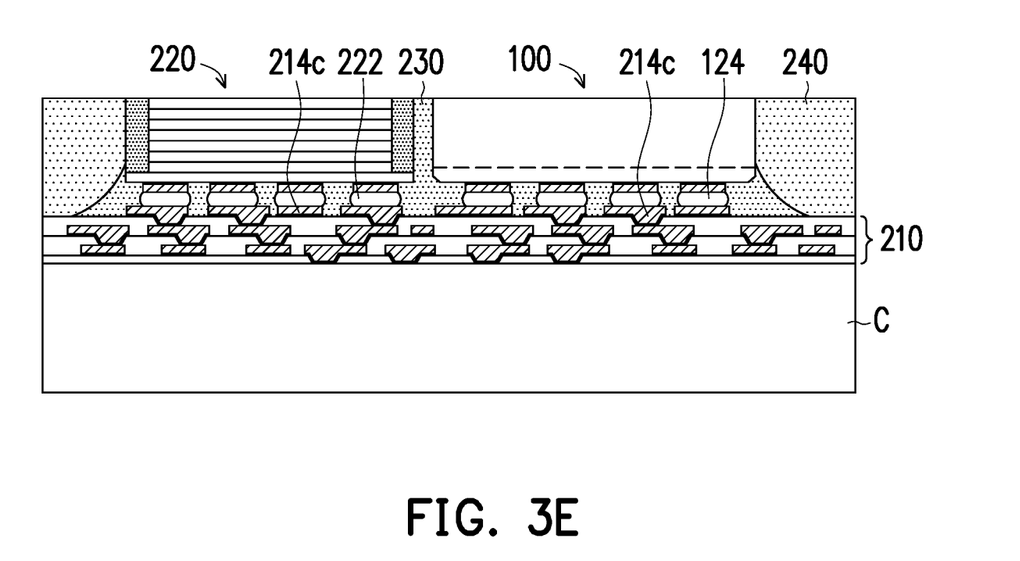

Referring to FIG. 3E, an underfill 230 is formed over the organic interposer substrate 210. The underfill 230 fills the space between the organic interposer substrate 210 and the semiconductor die 100 and the space between the organic interposer substrate 210 and semiconductor device 220 such that the conductive terminals 124 and the conductive terminals 222 are laterally encapsulated by the underfill 230. The underfill 230 may serve as stress buffer to improve the reliability of the conductive terminals 124 and 222. Accordingly, electrical connection between the organic interposer substrate 210 and semiconductor die 100 as well as electrical connection between the organic interposer substrate 210 and the semiconductor device 220 may be ensured.

As illustrated in FIG. 3E, an insulating encapsulation 240 is formed on the organic interposer substrate 210 to cover the semiconductor die 100, the semiconductor device 220, and the underfill 230. The insulating encapsulation 240 may be formed by an over-molding process or a film deposition process. After performing the over-molding process or film deposition process for forming the insulating encapsulation 240, as illustrated in FIG. 3E, a grinding process may be performed to partially remove the insulating encapsulation 240. After performing the grinding process, the thickness of the insulating encapsulation 240 is reduced. After performing the grinding process, the semiconductor die 100, the semiconductor device 220 and the underfill 230 are revealed. In some embodiments, the grinding process includes a mechanical grinding process, a CMP process, or combinations thereof. For example, the material of the insulating encapsulation 240 includes epoxy molding compound or other suitable dielectric materials.

Figure 3F:
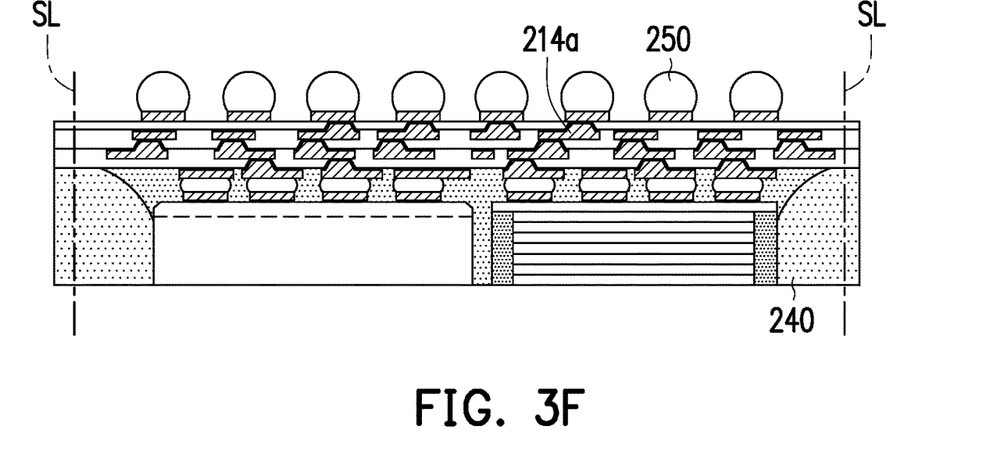

Referring to FIG. 3E and FIG. 3F, a removal process is performed to remove the carrier C from the organic interposer substrate 210 such that a back surface of the organic interposer substrate 210 is revealed. In some embodiments, the removal process of the carrier C includes a mechanical grinding process, a CMP process, an etching process, combinations thereof or other suitable removal processes. After performing the removal process of the carrier C, a wafer level bumping process is performed on the organic interposer substrate 210 such that conductive terminals 250 are formed on the first conductive wirings 214a of the organic interposer substrate 210. The above-mentioned wafer level bumping process may include: forming a patterned photoresist over the back surface of the organic interposer substrate 210, wherein the patterned photoresist includes openings for revealing the first conductive wirings 214a; depositing (e.g., plating) conductive material on the first conductive wirings 214a to form the conductive terminals 250 in the openings defined in the patterned photoresist; and removing the patterned photoresist. In some embodiments, the conductive terminals 250 may include controlled collapse chip connection (C4) bumps or the like.

As illustrated in FIG. 3E and FIG. 3F, a singulation process is performed along scribe lines SL to singulate the resultant structure illustrated in FIG. 3E. During the above-mentioned singulation process, the organic interposer substrate 210 and the insulating encapsulation 240 are cut-off along the scribe lines SL.

Figure 3G:
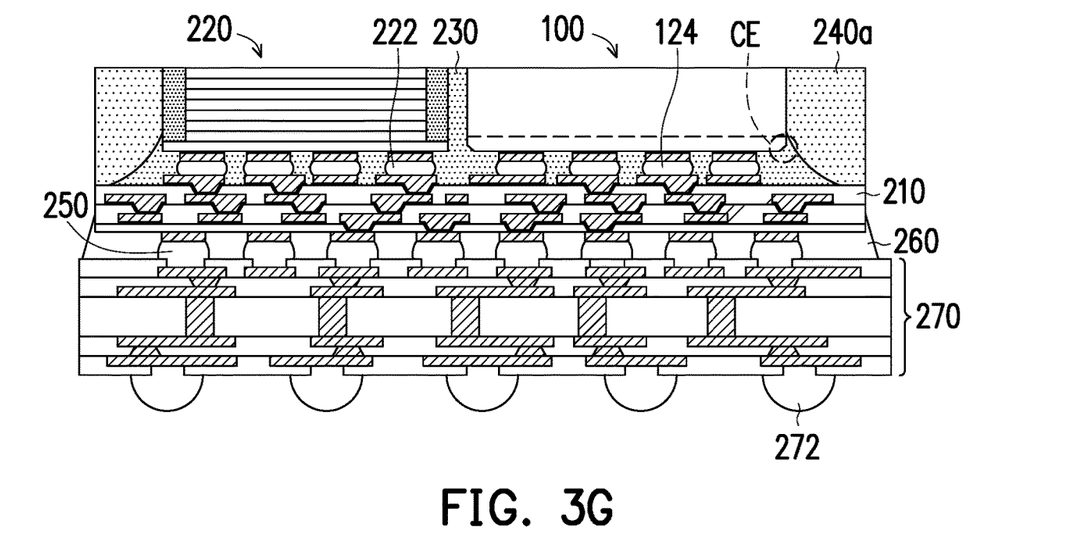

Referring to FIG. 3F and FIG. 3G, after the singulation process is performed, a singulated structure including an organic interposer substrate 210, a semiconductor die 100 having chamfered edges CE, a semiconductor device 220, conductive terminals (e.g., bumps) 124 and conductive terminals (e.g., bumps) 222, an underfill 230, an insulating encapsulation 240a, and conductive terminals 250 is obtained and flipped onto an upper surface of a circuit substrate 270 (e.g., printed circuit board). The organic interposer substrate 210 of the singulated structure is electrically connected to the circuit substrate 270 through the conductive terminals 250. A reflow process may be performed to reflow the conductive terminals 250 and bond the organic interposer substrate 210 of the singulated structure with the circuit substrate 270. Then, an underfill 260 is formed over the circuit substrate 270. The underfill 260 fills the space between the organic interposer substrate 210 and the circuit substrate 270 such that the conductive terminals 250 are laterally encapsulated by the underfill 260. The underfill 260 may serve as stress buffer to improve the reliability of the conductive terminals 250. Accordingly, electrical connection between the organic interposer substrate 210 and the circuit substrate 270 may be ensured.

The insulating encapsulation 240a covers the organic interposer substrate 210 and laterally encapsulates the semiconductor die 100 and the underfill 230. In some embodiments, sidewalls of the insulating encapsulation 240a are substantially aligned with sidewalls of the organic interposer substrate 210. The top surface of the insulating encapsulation 240a may be substantially level with the back surface of the semiconductor die 100 and the back surface of the semiconductor device 220. In some embodiments, the circuit substrate 270 further includes conductive terminals 272 distributed on a bottom surface thereof. The conductive terminals 272 may be ball grid array (BGA) balls. The material of the conductive terminals 272 may include solder material or the like.

As illustrated in FIG. 3G, the underfill 230 laterally encapsulates the conductive terminals 124 and the conductive terminals 222, and the underfill 230 is in direct contact with the chamfered edges CE of the semiconductor die 100. Since the semiconductor die 100 includes the chamfered edges CE (e.g., bevel surfaces), stress issue between the underfill 230 and the semiconductor die 100 may be improved. The details of the chamfered edges CE are described as followings in accompany with FIGS. 4A through 4D, FIGS. 5A through 5D, and FIGS. 6A through 6C.

FIGS. 4A through 4D are cross-sectional views schematically illustrating various chamfered edges or rounded edges in accordance with some embodiments of the present disclosure.

Figure 4A:
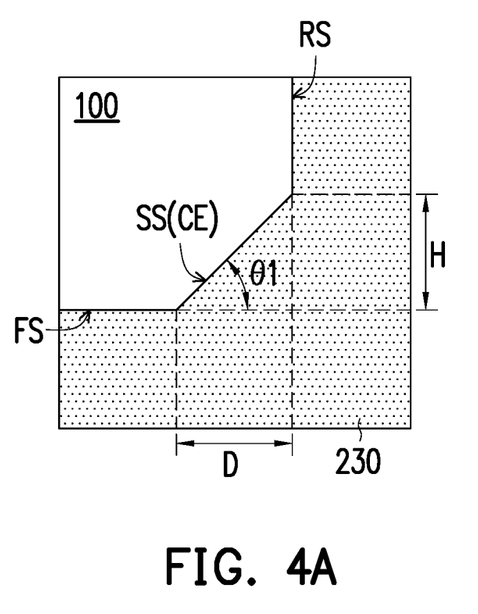
FIGS. 4A through 4D are cross-sectional views schematically illustrating various chamfered edges or rounded edges in accordance with some embodiments of the present disclosure.

Referring to FIG. 4A, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes a slanted surface or bevel surface SS extending between a root surface RS (the sidewall of the semiconductor die 100) and a front surface FS of the semiconductor die 100. The underfill 230 is in direct contact with a portion of the root surface RS, the slanted surface SS, and the front surface FS of the semiconductor die 100. The slanted surface SS of the chamfered edge CE is spaced apart from the insulating encapsulation 240a (shown in FIG. 3G) by the underfill 230. In other words, the slanted surface SS of the chamfered edge CE is not in contact with the insulating encapsulation 240a (shown in FIG. 3G). An exterior angle θ1 between the slanted surface SS of the chamfered edge CE and the front surface FS of the semiconductor die 100 may range from about 5 degree to about 80 degree.

Figure 4B:
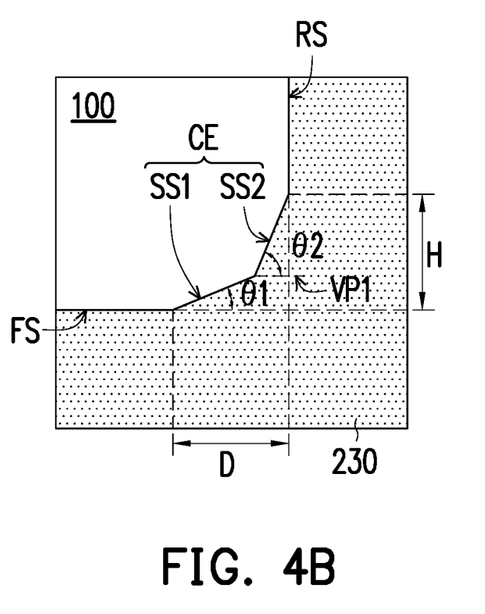

Referring to FIG. 4B, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes two connected slanted surfaces (e.g., bevel surfaces) SS1 and SS2 extending between a root surface RS (the sidewall of the semiconductor die 100) and a front surface FS of the semiconductor die 100. The underfill 230 is in direct contact with a portion of the root surface RS, the slanted surfaces SS1 and SS2 of the chamfered edge CE, and the front surface FS of the semiconductor die 100. The slanted surfaces SS1 and SS2 of the chamfered edge CE are spaced apart from the insulating encapsulation 240a (shown in FIG. 3G) by the underfill 230. In other words, the slanted surfaces SS1 and SS2 of the chamfered edge CE are not in contact with the insulating encapsulation 240a (shown in FIG. 3G). An exterior angle θ1 between the slanted surface SS1 of the chamfered edge CE and the front surface FS of the semiconductor die 100 may range from about 5 degree to about 85 degree, and an exterior angle θ2 between the slanted surface SS2 of the chamfered edge CE and a virtual plane VP1 paralleled with the front surface FS of the semiconductor die 100 may range from about 5 degree to about 85 degree. The exterior angle θ2 is greater than the exterior angle θ1.

Figure 4C:
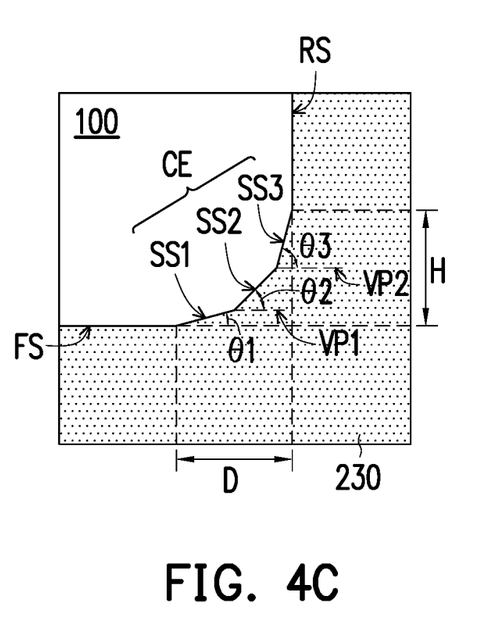

Referring to FIG. 4C, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes three connected slanted surfaces (e.g., bevel surfaces) SS1, SS2 and SS3 extending between a root surface RS (the sidewall of the semiconductor die 100) and a front surface FS of the semiconductor die 100. The underfill 230 is in direct contact with a portion of the root surface RS, the slanted surfaces SS1, SS2 and SS3 of the chamfered edge CE, and the front surface FS of the semiconductor die 100. The slanted surfaces SS1, SS2 and SS3 of the chamfered edge CE are spaced apart from the insulating encapsulation 240a (shown in FIG. 3G) by the underfill 230. In other words, the slanted surfaces SS1, SS2 and SS3 of the chamfered edge CE are not in contact with the insulating encapsulation 240a (shown in FIG. 3G). An exterior angle θ1 between the slanted surface SS1 of the chamfered edge CE and the front surface FS of the semiconductor die 100 may range from about 5 degree to about 85 degree, an exterior angle θ2 between the slanted surface SS2 of the chamfered edge CE and a virtual plane VP1 paralleled with the front surface FS of the semiconductor die 100 may range from about 5 degree to about 85 degree, and an exterior angle θ3 between the slanted surface SS3 of the chamfered edge CE and a virtual plane VP2 paralleled with the front surface FS of the semiconductor die 100 may range from about 5 degree to about 85 degree. The exterior angle θ3 is greater than the exterior angle θ2, and the exterior angle θ2 is greater than the exterior angle θ1.

Figure 4D:
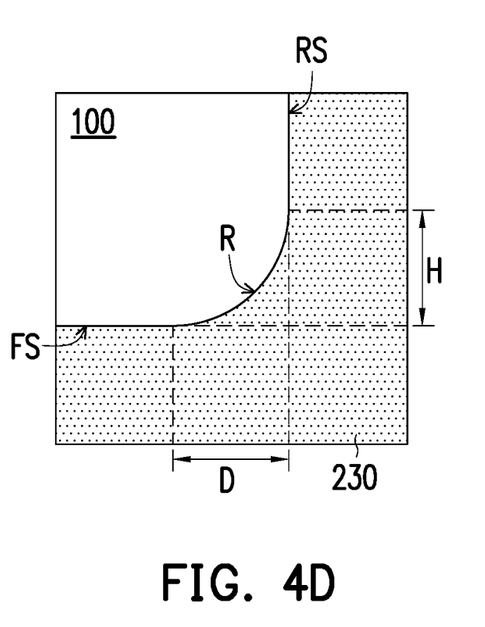

Referring to FIG. 4D, the semiconductor die 100 includes rounded edges RE. The width D of the rounded edges RE may range from about 5 micrometers to about 500 micrometers, and the height H of the rounded edges RE may range from about 5 micrometers to about 700 micrometers. In some embodiments, each of the rounded edges RE extends between a root surface RS (the side surface of the semiconductor die 100) and a front surface FS of the semiconductor die 100. The underfill 230 is in direct contact with a portion of the root surface RS, the rounded edge RE, and the front surface FS of the semiconductor die 100. The rounded edge RE is spaced apart from the insulating encapsulation 240a (shown in FIG. 3G) by the underfill 230. In other words, the rounded edge RE is not in contact with the insulating encapsulation 240a (shown in FIG. 3G). Since the semiconductor die 100 includes the rounded edge RE, stress issue between the underfill 230 and the semiconductor die 100 may be improved.

FIGS. 5A through 5D are cross-sectional views schematically illustrating various chamfered edges or rounded edges in accordance with some alternative embodiments of the present disclosure.

Figure 5A:
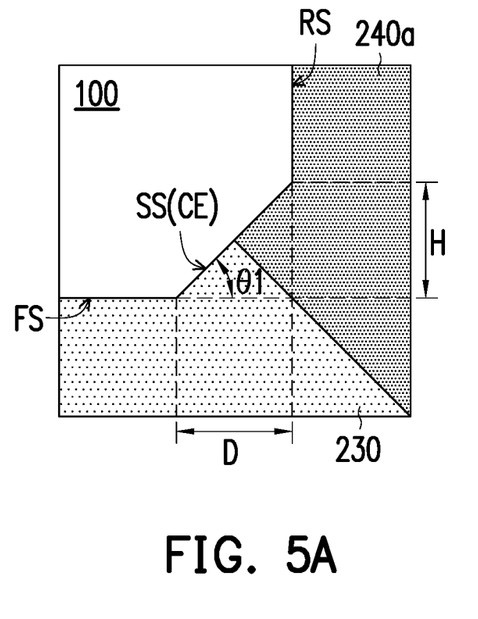
FIGS. 5A through 5D are cross-sectional views schematically illustrating various chamfered edges or rounded edges in accordance with some alternative embodiments of the present disclosure.

Referring to FIG. 5A, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes a slanted surface SS extending between a root surface RS (the sidewall of the semiconductor die 100) and a front surface FS of the semiconductor die 100. The underfill 230 is in direct contact with a lower portion of the slanted surface SS and the front surface FS of the semiconductor die 100. The insulating encapsulation 240a is in direct contact with an upper portion of the slanted surface SS and the root surface RS of the semiconductor die 100. The slanted surface SS is in direct contact with both the underfill 230 and the insulating encapsulation 240a. An exterior angle θ1 between the slanted surface SS of the chamfered edge CE and the front surface FS of the semiconductor die 100 may range from about 5 degree to about 85 degree.

Figure 5B:
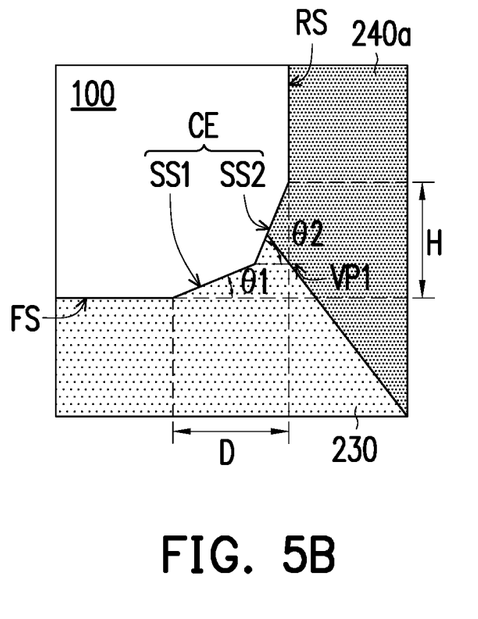

Referring to FIG. 5B, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes two connected slanted surfaces SS1 and SS2 extending between a root surface RS (the sidewall of the semiconductor die 100) and a front surface FS of the semiconductor die 100. The underfill 230 is in direct contact with the front surface FS of the semiconductor die 100, the slanted surface SS1, and a lower portion of the slanted surface SS2. The insulating encapsulation 240a is in direct contact with an upper portion of the slanted surface SS2 and the root surface RS of the semiconductor die 100. The slanted surface SS2 is in direct contact with both the underfill 230 and the insulating encapsulation 240a. An exterior angle θ1 between the slanted surface SS1 of the chamfered edge CE and the front surface FS of the semiconductor die 100 may range from about 5 degree to about 85 degree, and an exterior angle θ2 between the slanted surface SS2 of the chamfered edge CE and a virtual plane VP1 paralleled with the front surface FS of the semiconductor die 100 may range from about 5 degree to about 85 degree. The exterior angle θ2 is greater than the exterior angle θ1.

Figure 5C:
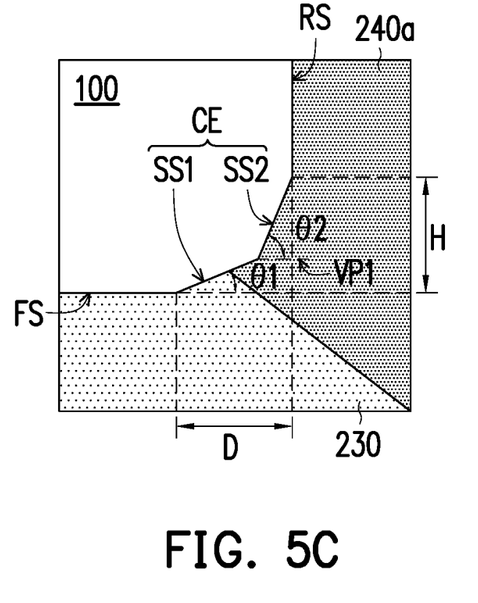

Referring to FIG. 5C, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes two connected slanted surfaces SS1 and SS2 extending between a root surface RS (the sidewall of the semiconductor die 100) and a front surface FS of the semiconductor die 100. The underfill 230 is in direct contact with the front surface FS of the semiconductor die 100 and a lower portion of the slanted surface SS1. The insulating encapsulation 240a is in direct contact with an upper portion of the slanted surface SS1, the slanted surface SS2, and the root surface RS of the semiconductor die 100. The slanted surface SS1 is in direct contact with both the underfill 230 and the insulating encapsulation 240*a*. An exterior angle θ1 between the slanted surface SS1 of the chamfered edge CE and the front surface FS of the semiconductor die 100 may range from about 5 degree to about 85 degree, and an exterior angle θ2 between the slanted surface SS2 of the chamfered edge CE and a virtual plane VP1 paralleled with the front surface FS of the semiconductor die 100 may range from about 5 degree to about 85 degree. The exterior angle θ2 is greater than the exterior angle θ1.

Figure 5D:
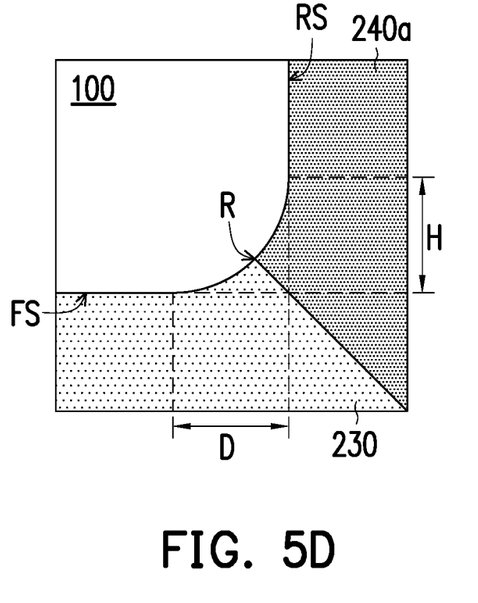

Referring to FIG. 5D, the semiconductor die 100 includes rounded edges RE. The width D of the rounded edges RE may range from about 5 micrometers to about 500 micrometers, and the height H of the rounded edges RE may range from about 5 micrometers to about 700 micrometers. In some embodiments, each of the rounded edges RE extends between a root surface RS (the side surface of the semiconductor die 100) and a front surface FS of the semiconductor die 100. The underfill 230 is in direct contact with a lower portion of the rounded edge RE and the front surface FS of the semiconductor die 100. The insulating encapsulation 240*a* is in direct contact with an upper portion of the rounded edge RE and the root surface RS of the semiconductor die 100. The rounded edge RE is in direct contact with both the underfill 230 and the insulating encapsulation 240*a*.

Figure 6A:
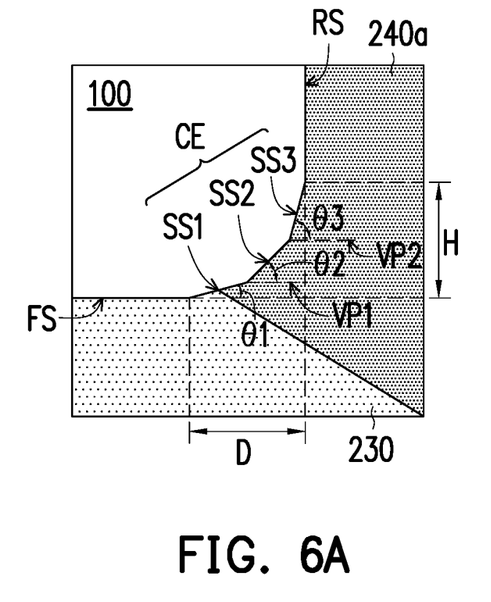
FIGS. 6A through 6C are cross-sectional views schematically illustrating various chamfered edges in accordance with some other embodiments of the present disclosure.
Figure 6B:
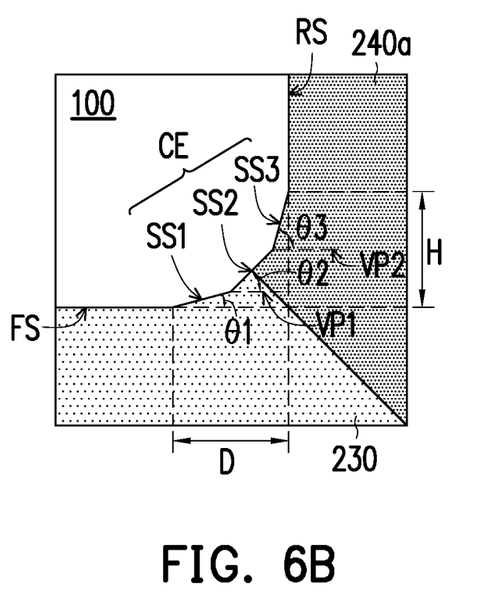
Figure 6C:
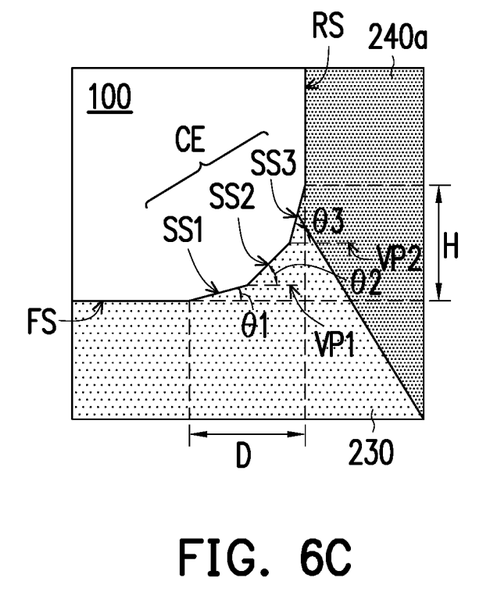

FIGS. 6A through 6C are cross-sectional views schematically illustrating various chamfered edges in accordance with some other embodiments of the present disclosure.

Referring to FIG. 6A, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes three connected slanted surfaces SS1, SS2 and SS3 extending between a root surface RS (the sidewall of the semiconductor die 100) and a front surface FS of the semiconductor die 100. The underfill 230 is in direct contact with the front surface FS of the semiconductor die 100 and a lower portion of the slanted surface SS1. The insulating encapsulation 240*a* is in direct contact with an upper portion of the slanted surface SS1, the slanted surface SS2, the slanted surface SS3, and the root surface RS of the semiconductor die 100. The insulating encapsulation 240*a* entirely covers the slanted surface SS2 and SS3. The slanted surface SS1 is in direct contact with both the underfill 230 and the insulating encapsulation 240*a*. An exterior angle θ1 between the slanted surface SS1 of the chamfered edge CE and the front surface FS of the semiconductor die 100 may range from about 5 degree to about 85 degree, an exterior angle θ2 between the slanted surface SS2 of the chamfered edge CE and a virtual plane VP1 paralleled with the front surface FS of the semiconductor die 100 may range from about 5 degree to about 85 degree, and an exterior angle θ3 between the slanted surface SS3 of the chamfered edge CE and a virtual plane VP2 paralleled with the front surface FS of the semiconductor die 100 may range from about 5 degree to about 85 degree. The exterior angle θ3 is greater than the exterior angle θ2, and the exterior angle θ2 is greater than the exterior angle θ1.

Referring to FIG. 6B, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes three connected slanted surfaces SS1, SS2 and SS3 extending between a root surface RS (the sidewall of the semiconductor die 100) and a front surface FS of the semiconductor die 100. The underfill 230 is in direct contact with the front surface FS of the semiconductor die 100, the slanted surface SS1, and a lower portion of the slanted surface SS2. The insulating encapsulation 240*a* is in direct contact with an upper portion of the slanted surface SS2, the slanted surface SS3, and the root surface RS of the semiconductor die 100. The underfill 230 may entirely cover the slanted surface SS1. The slanted surface SS2 is in direct contact with both the underfill 230 and the insulating encapsulation 240*a*. An exterior angle θ1 between the slanted surface SS1 of the chamfered edge CE and the front surface FS of the semiconductor die 100 may range from about 5 degree to about 85 degree, an exterior angle θ2 between the slanted surface SS2 of the chamfered edge CE and a virtual plane VP1 paralleled with the front surface FS of the semiconductor die 100 may range from about 5 degree to about 85 degree, and an exterior angle θ3 between the slanted surface SS3 of the chamfered edge CE and a virtual plane VP2 paralleled with the front surface FS of the semiconductor die 100 may range from about 5 degree to about 85 degree. The exterior angle θ3 is greater than the exterior angle θ2, and the exterior angle θ2 is greater than the exterior angle θ1.

Referring to FIG. 6C, the width D of the chamfered edges CE may range from about 5 micrometers to about 500 micrometers, and the height H of the chamfered edges CE may range from about 5 micrometers to about 700 micrometers. In some embodiments, at least one chamfered edge among the chamfered edges CE includes three connected slanted surfaces SS1, SS2 and SS3 extending between a root surface RS (the sidewall of the semiconductor die 100) and a front surface FS of the semiconductor die 100. The underfill 230 is in direct contact with the front surface FS of the semiconductor die 100, the slanted surface SS1, the slanted surface SS2, and a lower portion of the slanted surface SS3. The underfill 230 may entirely cover the slanted surfaces SS1 and SS2. The insulating encapsulation 240*a* is in direct contact with an upper portion of the slanted surface SS3 and the root surface RS of the semiconductor die 100. The slanted surface SS3 is in direct contact with both the underfill 230 and the insulating encapsulation 240*a*. An exterior angle θ1 between the slanted surface SS1 of the chamfered edge CE and the front surface FS of the semiconductor die 100 may range from about 5 degree to about 85 degree, an exterior angle θ2 between the slanted surface SS2 of the chamfered edge CE and a virtual plane VP1 paralleled with the front surface FS of the semiconductor die 100 may range from about 5 degree to about 85 degree, and an exterior angle θ3 between the slanted surface SS3 of the chamfered edge CE and a virtual plane VP2 paralleled with the front surface FS of the semiconductor die 100 may range from about 5 degree to about 85 degree. The exterior angle θ3 is greater than the exterior angle θ2, and the exterior angle θ2 is greater than the exterior angle θ1.

In accordance with some embodiments of the disclosure, a package structure including an organic interposer substrate, a semiconductor die, conductive bumps, a first underfill, and an insulating encapsulation is provided. The organic interposer substrate includes stacked organic dielectric layers and conductive wirings embedded in the stacked organic dielectric layers. The semiconductor die is disposed over and electrically connected to the conductive wirings of the organic interposer substrate, and the semiconductor die includes chamfered edges. The conductive bumps are disposed between the semiconductor die and the organic interposer substrate, and the semiconductor die is electrically connected to the organic interposer substrate through the conductive bumps. The first underfill is disposed between the semiconductor die and the organic interposer substrate, wherein the first underfill encapsulates the conductive bumps and is in contact with the chamfered edges of the at least one semiconductor die. The insulating encapsulation covers the organic interposer substrate and laterally encapsulates the least one semiconductor die and the first underfill. In some embodiments, a width of the chamfered edges ranges from about 5 micrometers to about 500 micrometers, and a height of the chamfered edges ranges from about 5 micrometers to about 700 micrometers. In some embodiments, at least one chamfered edge among the chamfered edges comprises at least one slanted surface extending between a root surface and a front surface of the semiconductor die, and the first underfill is in contact with the slanted surfaces of the chamfered edges. In some embodiments, the first underfill is further in contact with first portions of the root surfaces, and the insulating encapsulation is in contact with second portions of the root surfaces. In some embodiments, at least one chamfered edge among the chamfered edges comprises at least one slanted surface extending between a root surface and a front surface of the semiconductor die, the first underfill is in contact with first portions of the slanted surfaces of the chamfered edges, and the insulating encapsulation is in contact with second portions of the slanted surfaces of the chamfered edges. In some embodiments, at least one chamfered edge among the chamfered edges comprises a first slanted surface and a second slanted surface, the first slanted surface extends between a front surface of the semiconductor die and the second slanted surface, the second slanted surface extends between the first slanted surface and a root surface, the first slanted surface is entirely covered by the first underfill, the second slanted surface is in contact with the first underfill and the insulating encapsulation. In some embodiments, sidewalls of the insulating encapsulation are substantially aligned with sidewalls of the organic interposer substrate. In some embodiments, a coefficient of thermal expansion of the stacked organic dielectric layers is greater than a coefficient of thermal expansion of a semiconductor substrate of the semiconductor die. In some embodiments, the package structure further includes a circuit substrate; first conductive terminals disposed on and electrically connected to the circuit substrate; second conductive terminals disposed on and electrically connected to the circuit substrate; and a second underfill disposed between the organic interposer substrate and the circuit substrate. The organic interposer substrate is electrically connected to the circuit substrate through the first conductive terminals, and the first conductive terminals and the second conductive terminals are disposed on opposite sides of the circuit substrate. The second underfill encapsulates the first conductive terminals.

In accordance with some other embodiments of the disclosure, a package structure including an interposer substrate, a semiconductor die, conductive bumps, and an underfill is provided. The interposer substrate includes stacked dielectric layers and conductive wirings embedded in the stacked dielectric layers. The semiconductor die is disposed over and electrically connected to the interposer substrate, and a coefficient of thermal expansion of the stacked dielectric layers being greater than a coefficient of thermal expansion of a semiconductor substrate of the semiconductor die. The semiconductor die comprises chamfered edges, and at least one chamfered edge among the chamfered edges comprises bevel surfaces. The conductive bumps are disposed between the semiconductor die and the interposer substrate, and the semiconductor die is electrically connected to the interposer substrate through the conductive bumps. The underfill is disposed between the semiconductor die and the interposer substrate. In some embodiments, a width of the chamfered edges ranges from about 5 micrometers to about 500 micrometers, and a height of the chamfered edges ranges from about 5 micrometers to about 700 micrometers. In some embodiments, the underfill is in contact with the bevel surfaces of the chamfered edges and the root surfaces. In some embodiments, sidewalls of the insulating encapsulation are substantially aligned with sidewalls of the interposer substrate. In some embodiments, the package structure further includes a circuit substrate, wherein the interposer substrate is electrically connected to the circuit substrate.

In accordance with some other embodiments of the disclosure, a package structure including an organic interposer substrate, a semiconductor die, conductive bumps, and a first underfill is provided. The organic interposer substrate includes stacked organic dielectric layers and conductive wirings embedded in the stacked organic dielectric layers. The semiconductor die is disposed over and electrically connected to the conductive wirings of the organic interposer substrate, and the semiconductor die includes rounded edges. The conductive bumps are disposed between the semiconductor die and the organic interposer substrate, and the semiconductor die is electrically connected to the organic interposer substrate through the conductive bumps. The first underfill is disposed between the semiconductor die and the organic interposer substrate. In some embodiments, each of the rounded edges extends between a front surface of the semiconductor die and a side surface of the semiconductor die, and the first underfill is in contact with the rounded edges. In some embodiments, the package structure further includes an insulating encapsulation covering the organic interposer substrate and laterally encapsulating the least one semiconductor die and the first underfill, wherein the rounded edges of the semiconductor die being spaced apart from the insulating encapsulation by the first underfill. In some embodiments, the first underfill is further in contact with first portions of the side surfaces of the semiconductor die, and the insulating encapsulation is in contact with second portions of the side surfaces of the semiconductor die. In some embodiments, sidewalls of the insulating encapsulation are substantially aligned with sidewalls of the organic interposer substrate. In some embodiments, the package structure further includes a circuit substrate, first conductive terminals, second conductive terminals and a second underfill. The first conductive terminals are disposed on and electrically connected to the circuit substrate. The second conductive terminals are disposed on and electrically connected to the circuit substrate, wherein the organic interposer substrate is electrically connected to the circuit substrate through the first conductive terminals, and the first conductive terminals and the second conductive terminals are disposed on opposite sides of the circuit substrate. The second underfill disposed between the organic interposer substrate and the circuit substrate, wherein the second underfill encapsulates the first conductive terminals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
an interposer substrate;
a semiconductor die disposed over and electrically connected to the interposer substrate, and the semiconductor die comprising chamfered edges;
conductive bumps disposed between the semiconductor die and the interposer substrate, wherein the semiconductor die is electrically connected to the interposer substrate through the conductive bumps;
a first underfill disposed between the semiconductor die and the interposer substrate, wherein the first underfill encapsulates the conductive bumps and covers the chamfered edges of the semiconductor die; and
an insulating encapsulation covering the interposer substrate and laterally encapsulating the semiconductor die and the first underfill, wherein at least one chamfered edge among the chamfered edges comprises at least one slanted surface extending between a root surface of the semiconductor die and a front surface of the semiconductor die, the first underfill and the insulating encapsulation are in direct contact with the at least one slanted surface of the chamfered edges.

2. The structure as claimed in claim 1, wherein a width of the chamfered edges ranges from about 5 micrometers to about 500 micrometers, and a height of the chamfered edges ranges from about 5 micrometers to about 700 micrometers.

3. The structure as claimed in claim 1, wherein the chamfered edges comprises a first slanted surface and a second slanted surface, the first slanted surface extends between the front surface of the semiconductor die and the second slanted surface, the second slanted surface extends between the first slanted surface and the root surface of the semiconductor die, the first underfill is in contact with the front surface, the first slanted surface and the second slanted surface, and the insulating encapsulation is in contact with the root surface and the second slanted surface.

4. The structure as claimed in claim 1, wherein the at least one chamfered edge among the chamfered edges comprises a first slanted surface and a second slanted surface, the first slanted surface extends between the front surface of the semiconductor die and the second slanted surface, the second slanted surface extends between the first slanted surface and the root surface of the semiconductor die, the first underfill is in contact with the front surface and the first slanted surface, and the insulating encapsulation is in contact with the root surface, the second slanted surface and the first slanted surface.

5. The structure as claimed in claim 1, wherein the at least one chamfered edge among the chamfered edges comprises a first slanted surface and a second slanted surface, the first slanted surface extends between the front surface of the semiconductor die and the second slanted surface, the second slanted surface extends between the root surface of the semiconductor die and the first slanted surface, the second slanted surface is entirely covered by the insulating encapsulation, the first slanted surface is in contact with the first underfill and the insulating encapsulation.

6. The structure as claimed in claim 1, wherein the at least one chamfered edge among the chamfered edges comprises a first slanted surface and a second slanted surface, the first slanted surface extends between the front surface of the semiconductor die and the second slanted surface, the second slanted surface extends between the root surface of the semiconductor die and the first slanted surface, the first slanted surface is entirely covered by the first underfill, the second slanted surface is in contact with the first underfill and the insulating encapsulation.

7. The structure as claimed in claim 1, wherein sidewalls of the insulating encapsulation are substantially aligned with sidewalls of the interposer substrate.

8. The structure as claimed in claim 1, wherein the interposer substrate comprises stacked dielectric layers and conductive wirings embedded in the stacked dielectric layers, and a coefficient of thermal expansion of the stacked dielectric layers is greater than a coefficient of thermal expansion of a semiconductor substrate of the semiconductor die.

9. The structure as claimed in claim 1 further comprising:
a circuit substrate;
first conductive terminals disposed on and electrically connected to the circuit substrate;
second conductive terminals disposed on and electrically connected to the circuit substrate, wherein the interposer substrate is electrically connected to the circuit substrate through the first conductive terminals, and the first conductive terminals and the second conductive terminals are disposed on opposite sides of the circuit substrate; and
a second underfill disposed between the interposer substrate and the circuit substrate, wherein the second underfill encapsulates the first conductive terminals.

10. A package structure, comprising:
an interposer substrate;
a semiconductor die disposed over and electrically connected to the interposer substrate, a coefficient of thermal expansion of dielectric layers of the interposer substrate being greater than a coefficient of thermal expansion of a semiconductor substrate of the semiconductor die, wherein the semiconductor die comprises chamfered edges, at least one chamfered edge among the chamfered edges comprises bevel surfaces, and the bevel surfaces connect at least one root surface of the semiconductor die and a front surface of the semiconductor die;
an underfill disposed between the semiconductor die and the interposer substrate; and
an insulating encapsulation covering the interposer substrate and laterally encapsulating the semiconductor die and the underfill, wherein the bevel surfaces are in direct contact with the underfill and the insulating encapsulation.

11. The structure as claimed in claim 10, wherein a width of the chamfered edges ranges from about 5 micrometers to about 500 micrometers, and a height of the chamfered edges ranges from about 5 micrometers to about 700 micrometers.

12. The structure as claimed in claim 10, wherein the underfill is in contact with the bevel surfaces of the chamfered edges and the at least one root surface of the semiconductor die.

13. The structure as claimed in claim 10, wherein sidewalls of the insulating encapsulation are substantially aligned with sidewalls of the interposer substrate.

14. The structure as claimed in claim 10 further comprising a circuit substrate, wherein the interposer substrate is electrically connected to the circuit substrate.

15. A package structure, comprising:
an interposer substrate;

a semiconductor die disposed over and electrically connected to the interposer substrate, and the semiconductor die comprising at least one first edge and at least one second edge, the at least one first edge comprising a chamfered edge or a rounded edge, the at least one second edge being between a side surface of the semiconductor die and a front surface of the semiconductor die;

a first underfill disposed between the semiconductor die and the interposer substrate; and an insulating encapsulation covering the interposer substrate and laterally encapsulating the semiconductor die and the first underfill, wherein the chamfered edge or the rounded edge is in direct contact with the first underfill and the insulating encapsulation.

16. The structure as claimed in claim 15, wherein the at least one first edge comprises the chamfered edge, the chamfered edge comprises at least one slanted surface extending between a root surface of the semiconductor die and the front surface of the semiconductor die, the first underfill and the insulating encapsulation are in direct contact with the at least one slanted surface of the chamfered edges.

17. The structure as claimed in claim 15, wherein the at least one first edge comprises the rounded edge extending between the front surface of the semiconductor die and the side surface of the semiconductor die, and the rounded edge is spaced apart from the insulating encapsulation by the first underfill.

18. The structure as claimed in claim 17, wherein the first underfill and the insulating encapsulation are in contact with the side surface of the semiconductor die.

19. The structure as claimed in claim 17, wherein sidewalls of the insulating encapsulation are substantially aligned with sidewalls of the interposer substrate.

20. The structure as claimed in claim 15 further comprising:

a circuit substrate;

first conductive terminals disposed on and electrically connected to the circuit substrate;

second conductive terminals disposed on and electrically connected to the circuit substrate, wherein the interposer substrate is electrically connected to the circuit substrate through the first conductive terminals, and the first conductive terminals and the second conductive terminals are disposed on opposite sides of the circuit substrate; and a second underfill disposed between the interposer substrate and the circuit substrate, wherein the second underfill encapsulates the first conductive terminals.

* * * * *